US006203684B1

(12) United States Patent
Taylor et al.

(10) Patent No.: US 6,203,684 B1
(45) Date of Patent: Mar. 20, 2001

(54) PULSE REVERSE ELECTRODEPOSITION FOR METALLIZATION AND PLANARIZATION OF A SEMICONDUCTOR SUBSTRATES

(75) Inventors: E. Jennings Taylor, Troy, OH (US); Chengdong Zhou, Salem, OR (US); Jenny J. Sun, Tipp City, OH (US)

(73) Assignee: Faraday Technology Marketing Group, LLC, Troy, OH (US)

( * ) Notice: Subject to any disclaimer, the term of this patent is extended or adjusted under 35 U.S.C. 154(b) by 0 days.

(21) Appl. No.: 09/172,299

(22) Filed: Oct. 14, 1998

(51) Int. Cl.$^7$ ....................................... C25D 5/18
(52) U.S. Cl. ...................... 205/103; 205/105; 205/123
(58) Field of Search ............................ 205/103, 105, 205/123

(56) References Cited

U.S. PATENT DOCUMENTS 4,666,567 * 5/1987 Loch .................................. 205/103
5,489,488 * 2/1996 Asai et al. ........................... 428/611
5,972,192 * 10/1999 Dubin et al. ........................ 205/101

* cited by examiner

Primary Examiner—Kathryn Gorgos
Assistant Examiner—Wesley A. Nicolas
(74) Attorney, Agent, or Firm—Vorys, Sater, Seymour and Pease LLP (57) ABSTRACT

A smooth layer of a metal is electroplated onto a microrough electrically conducting substrate by immersing the substrate and a counterelectrode in an electroplating bath of the metal to be electroplated and passing a modulated reversing electric current between the electrodes. The current contains pulses that are cathodic with respect to said substrate and pulses that are anodic with respect to said substrate. The cathodic pulses have a duty cycle less than about 50% and said anodic pulses have a duty cycle greater than about 50%, the charge transfer ratio of the cathodic pulses to the anodic pulses is greater than one, and the frequency of said pulses ranges from about 10 Hertz to about 5000 Hertz.

21 Claims, 4 Drawing Sheets

PULSE REVERSE ELECTRODEPOSITION FOR METALLIZATION AND PLANARIZATION OF A SEMICONDUCTOR SUBSTRATES

ORIGIN OF THE INVENTION

The experimental work leading to this invention was funded in part by U.S. Air Force Materials Command Contracts No. F33615-98-C-1273.

BACKGROUND OF THE INVENTION

1. Field of the Invention

This invention relates to electrodeposition of metals and more particularly to electrodeposition of metals into microscopic recesses on the surface of a substrate and formation of uniform layers of electrodeposited metal on a substrate.

2. Brief Description of the Prior Art

The manufacture of semiconductor devices, especially very large scale integrated (VLSI) chips is driven by technical and economic considerations toward the production of devices comprising greater numbers of transistors and associated circuits on a single semiconductor chip or wafer. The most complex chips manufactured today have a few million transistors on a semiconductor chip no larger than several millimeters on a side. The electrical interconnections between the transistors in such chips are provided by fine wires of a conductive metal extending in channels formed horizontally and vertically in the body of the chip. Conventionally, these electrical connections have been made of aluminum, which can be deposited through vapor phase deposition techniques such as physical vapor deposition (PVD) and chemical vapor deposition (CVD). However, as the dimensions of the transistors have decreased into the submicron region, the cross sections of the connections have also decreased and the resistance of the connections has increased. In order to reduce the resistance of the connections in VLSI circuits containing devices of submicron dimensions, the use of copper as a connecting material has come to be favored.

Furthermore, as the dimensions of the interconnections between the devices have decreased, the use of conductors of high aspect ratio has become desirable. When VLSI devices are prepared by the damascene process, which requires that the conducting metal be deposited into trenches formed in a layer of insulating material, it has been found difficult to achieve void-free metal deposits in trenches having high aspect ratios by PVD or CVD.

Attempts have been made to deposit copper conductors into trenches on damascene-prepared surfaces by electroplating. However, it has proved difficult to prepare void-free, and inclusion-free deposits in trenches of high aspect ratio. Furthermore, electroplating of copper into trenches of a damascene-prepared surface has required depositing a relatively thick layer of copper over the entire surface of the wafer. The excess copper must then be removed by chemical-mechanical polishing (CMP), which is a time-consuming process that also generates substantial amounts of waste slurries that require careful and expensive disposal procedures.

Electroplating has also been used to deposit a thin layer of copper on the surface of a large semiconductor wafer preparatory to forming electrical interconnections by the customary masking and etching procedures. However, because of the tendency of electroplating procedures to deposit excess metal at the edges of the wafer, it has proved difficult to prepare perfectly uniform layers of copper. Auxiliary electrodes have been used to surround the edges of the wafer in order to provide a uniform electric field, as disclosed, for example in U.S. Pat. No. 5,135,636, to Yee et al. However, such procedures require additional equipment and are evidently wasteful of copper metal.

Accordingly, a need has continued to exist for a method of depositing metallic conductors, especially copper, in damascene trenches and for depositing a thin uniform layer of a metal such as copper over the entire surface of a semiconductor wafer with minimal need for subsequent planarization.

SUMMARY OF THE INVENTION

The problems encountered in electrodeposition of smooth, crevice-filling layers of a metal on a substrate have now been alleviated by the method of this invention, wherein a metal is selectively deposited on a substrate to provide a coating that fills microscopic depressions in the substrate without excessive deposition of metal at or near convex portions of the substrate surface such as protuberances and edges. The selective deposition is accomplished by a process in which an electrically conductive substrate, which may be a semiconductor wafer having one or more microscopic recesses on its surface or a large semiconductor wafer, and a counter electrode are immersed in an electroplating bath containing ions of the metal to be deposited in said recess, and a modulated reversing electric current is passed through the plating bath having pulses that are cathodic with respect to the substrate and pulses that are anodic with respect to the substrate, the cathodic pulses having a short duty cycle and the anodic pulses having a long duty cycle, the charge transfer ratio of the cathodic pulses to the anodic pulses being greater than one, and the frequency of the pulses ranging from about 10 Hertz to about 5 kilohertz.

Accordingly, it is an object of the invention to provide an electrochemical method for depositing a metal on a substrate.

A further object is to provide a method for selective electrodeposition of a metal on a substrate having microscopic recesses on its surface.

A further object is to provide a method for depositing metal from an electrolytic bath onto a substrate while preventing excessive deposition at corners and protuberances of the substrate.

A further object is to provide a method for forming a void-free deposit of metal in a microscopic recess on the surface of a substrate.

A further object is to provide a method for electrodepositing a uniform layer of a metal on a surface without preferential deposition on surface edges and protuberances.

Further objects of the invention will become apparent from the description of the invention which follows.

DETAILED DESCRIPTION OF THE INVENTION AND PREFERRED EMBODIMENTS

The distribution of metal electrodeposited on an electrically conductive substrate is determined by the local variations in the electrical current density. The primary current density in an electroplating cell is determined by the geometry of the electrodes. Typically, the primary current density is inversely proportional to the distance between the cathode and the anode along the path that the current follows between the electrodes.

When a voltage is first applied to the electroplating cell, the metal ions in solution in contact with the cathode are deposited on the cathode and the concentration of the ions in the adjacent solution decreases. Consequently, a concentration gradient is established near the cathode, and metal ions accordingly diffuse from the bulk solution region of relatively high concentration toward the depleted region adjacent to the cathode. This layer of depleted and variable metal ion concentration is the Nernst diffusion layer. In direct-current (DC) electroplating, the Nernst diffusion layer will rapidly reach a steady-state thickness that is determined by the current density and the degree of agitation of the bath which produces a relative motion of the bulk electrolyte with respect to the electrode. The more vigorous the agitation of the electrolyte in the plating bath, the thinner the Nernst diffusion layer will be. However, even for very vigorous relative motion between the bulk electrolyte and the electrode, e.g., with use of a rotating disk electrode, the thickness of the Nernst diffusion layer will still amount to several micrometers.

Figure 2A:
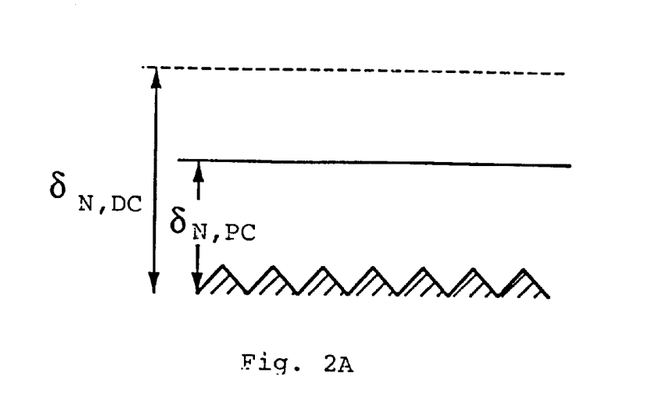
FIG. 2A illustrates the thickness of the Nernst diffusion layer with respect to the surface roughness of an electroplating substrate having a microrough surface.
Figure 2B:
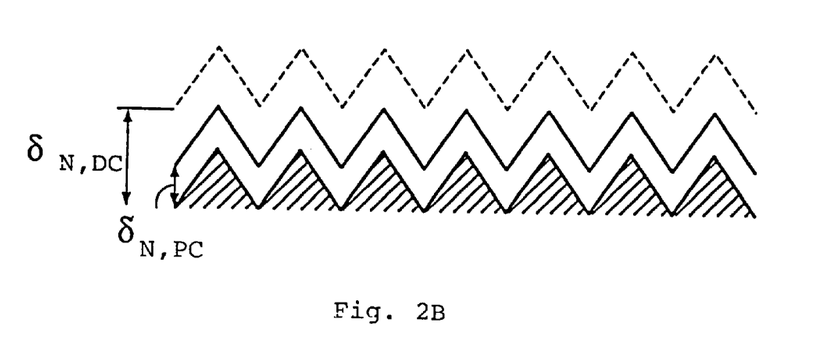
FIG. 2B illustrates the thickness of the Nernst diffusion layer with respect to the surface roughness of an electroplating substrate having a macrorough surface.

The substrate surface will not, in general, be perfectly smooth. If the roughness of the surface, i.e., the size of the peaks and valleys therein, is large compared with the thickness $\delta_{N,DC}$ of the Nernst diffusion layer (a "macrorough" surface), the layer will tend to follow the surface asperities, as shown in FIG. 2B. Under these circumstances the electric field which determines the primary current distribution will be greater at the tips of the asperities than in the valleys. Accordingly, electrochemical reduction, i.e., deposition of metal, will take place preferentially at the peaks. The current flow in the electrolyte will establish a somewhat greater overpotential in the depressions of a macrorough surface than at the peaks, which will tend to provide a secondary current distribution that still favors metal deposition at the peaks, although perhaps not as much as the primary current distribution.

FIG. 2B indicates that, on a macrorough surface, the Nernst diffusion layer follows the contour of the surface asperities. Accordingly, the distribution of electrodeposited metal is not greatly affected by microvariations in current distribution caused by microasperities, as is the case for microrough substrates, as illustrated in FIG. 2A and discussed below. Therefore the thickness of the metal deposit on the peaks and valleys of a macrorough surface is determined essentially by the primary and secondary current distribution.

In conventional electroplating of industrial objects, the dimensions of any surface features are large with respect to the thickness of the Nernst diffusion layer. This relationship extends even to relatively small articles such as printed circuit boards, where the smallest features, e.g., through-holes, typically have dimensions of the order of 10–15 mils.

However, in electroplating of semiconductor wafers the surface features are significantly smaller than the Nernst diffusion layer. Such surfaces may be termed "microrough". In such microrough surfaces, as illustrated in FIG. 2A, showing the thickness $\delta_{N,DC}$ of the diffusion layer with respect to the surface roughness, the diffusion layer will not follow the microscopic peaks and valleys of the surface. Under such circumstances, the current distribution will also favor the deposition of metal at the peaks of the asperities, once the diffusion layer is established, because the concentration of metal ions, as determined by their rate of diffusion from the bulk phase, will tend to be slightly greater at the peaks. Such a current distribution is generally referred to as the tertiary current distribution.

The small features found on the surface of semiconductor wafers may be residual roughness from the cutting and polishing processes used in preparing the wafer. However, the small trenches prepared in the damascene process, which are typically less than 1–2 micrometers in breadth and depth, are also smaller than the thickness of the Nernst diffusion layer. Accordingly, semiconductor surfaces may be considered to be microrough, whether they are encountered in the unprocessed wafer or deliberately prepared in the course of manufacturing a VLSI chip.

In DC electroplating it is conventional to counteract the tendency of the metal to be deposited at the peaks of the surface roughness by adding certain chemicals to the plating bath to improve its "throwing power." These additives help to produce a level coating of the metal. However, experience with such additives has been generally confined to electroplating onto macrorough substrates, and their mode of operation is not entirely understood. The additives are used in small amounts, and different applications have typically used different formulations. Consequently, it is to be expected that development of additives suitable for enhancing throwing power when plating onto microrough surfaces ("microthrowing power") would require extensive experimentation. Furthermore, because very small concentrations of additives are used, the measurement and control of the additive concentration presents substantial difficulties. Finally, the additives tend to be occluded within the plating to some extent. Such inclusions may not be a problem in conventional electroplating, but inclusions in the microscopic conductors of a VLSI semiconductor chip can cause increased resistance and quality control problems.

However, it is also possible to control the deposition of metal by using a modulated electric field. As explained in U.S. Pat. No. 5,599,437, to Taylor et al., the entire disclosure of which is incorporated herein by reference, the use of a pulsed electric field, which produces a corresponding pulsed current through the electroplating cell, causes a more uniform deposition of metal over the entire surface of a microrough substrate. In general, the shorter the cathodic pulse, the more uniform the electrodeposition reaction will be, because the concentration of metal ions immediately adjacent all portions of the substrate surface will more closely approach the initial bulk concentration in the electrolyte. This increased uniformity of electrolyte concentration is related to the thinner average thickness of the Nernst diffusion layer when a pulsed current is used ($\delta_{N,PC}$ in FIGS. 2A and 2B). The longer the pulse duration, the thicker will be the Nernst diffusion layer, and the more the current distribution and the corresponding distribution of plated metal will approach the current and metal deposition pattern characteristic of direct-current plating. In the case of the macrorough surface (FIG. 2B) the thinner pulsed-current (PC) diffusion layer is not qualitatively different from the diffusion layer produced by DC electrolysis; both generally conform to the asperities of the substrate surface. However, for the microrough surface, the Nernst diffusion layer becomes relatively greater with respect to the microasperities as the pulses become longer. Accordingly, the metal distribution will become more like that produced by direct-current plating, i.e., preferential deposition of metal on the peaks, or convex portions, of the microscopic asperities.

Conversely, if a microrough metal surface is made the anode in an electrolysis cell using direct current, the tertiary current distribution will favor removal of metal from the peaks of the microasperities over removal of metal from the microscopic depressions in the surface. In this case also, short pulses tend to remove metal uniformly from the surface. However, longer anodic pulses will tend to approach the non-uniform metal removal observed with direct current electrolysis.

According to the invention, a metal layer having a planar smooth surface can be deposited on a microrough surface by using a modulated electric field in which cathodic and anodic pulses are applied successively. Relatively short cathodic pulses are applied to favor uniform deposition of metal over both the peaks or convex portions of the microrough surface as well as the depressions or concave portions of the surface. The relatively short cathodic pulses are followed by relatively long anodic pulses, which favor the non-uniform removal of metal, i.e., removal of metal preferentially from the peaks or convex portions of the microrough surface. Preferably the relatively long anodic pulses are interspersed frequently between the relatively short cathodic pulses, and may even alternate with the short cathodic pulses.

The method of the invention can also be applied to deposition of metal conductors in damascene-prepared trenches on surfaces that have already been made very smooth, such as in the fabrication of very large scale integrated (VLSI) semiconductor devices. In such an application, the relatively short cathodic pulses will favor uniform deposition of metal into the trenches as well as onto the surface. The subsequent relatively long anodic pulses will favor dissolution of metal from the planar surface while tending to leave metal that has already been deposited in the trenches. As a result, when the full depth of the trenches has been filled with metal, the depth of the metal layer on the on the surface of the wafer will be significantly less than that in the trenches. Accordingly, the excess metal that has to be removed from the surface, e.g., by chemical-mechanical polishing (CMP), to planarize the chip and isolate the conductors is substantially less than that which would have been deposited without the use of the modulated reverse field.

The method of the invention may also be applied to depositing a thin planar layer of a metal uniformly across the surface of a substrate, e.g., a large semiconductor wafer having a diameter of up to 8 inches or greater. Such wafers are typically initially polished to a very smooth surface having deviations from planarity of the order of no more than several nanometers. Thereupon, a layer of electrically conductive metal, e.g., copper is deposited on the surface, and the metal layer is subsequently masked and etched by conventional procedures to form electrical connections between devices. As the process is currently implemented, the layer of conductive metal is of the order of one micrometer in thickness, and may be slightly thinner or slightly greater, depending on the engineering requirements for manufacturing a particular VLSI integrated circuit. In this application, the deposition of metal using modulated reverse electric fields will also tend to fill preferentially any microdepressions remaining in the surface of the wafer. However, a more important result is to prevent deposition of a non-uniform layer having an excessive thickness near the edge of the wafer. Any excess metal deposited during the relatively short cathodic pulses is preferentially depleted during the longer anodic pulses. Consequently, the method of the invention tends to produce plated semiconductor wafer wherein the metal layer is uniform across the entire wafer, even to the edges.

Figure 1:
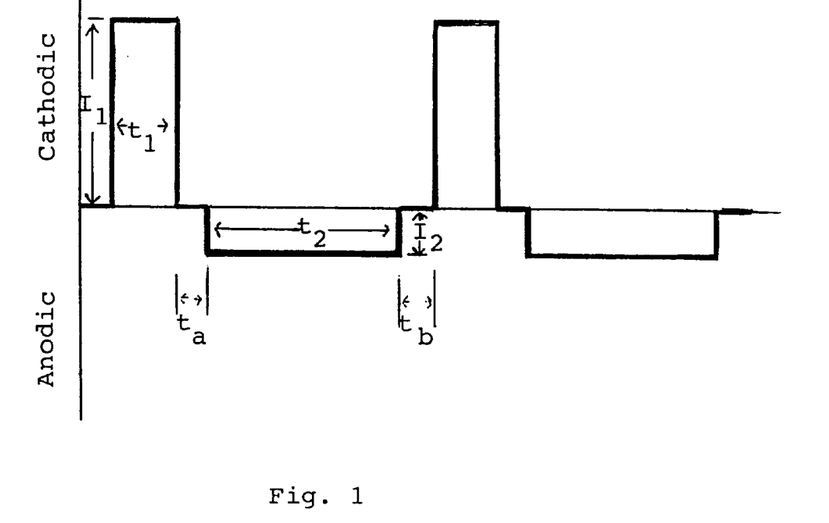
FIG. 1 illustrates the waveform of modulated reverse electric current used in the method of the invention.

A schematic representation of a rectangular modulated reverse electric field waveform used in the process of the invention is illustrated in FIG. 1. The waveform essentially comprises a cathodic (forward) pulse followed by an anodic (reverse) pulse. An off-period or relaxation period may follow either or both of the cathodic and anodic pulses. Those skilled in the art will recognize that the voltage and current will be proportional under the circumstances of the electrolytic process of the invention. Accordingly, the ordinate in FIG. 1 could represent either current or voltage. Although it is generally more convenient in practice to control the voltage, the technical disclosure of the process is more straightforward if discussed in terms of the current flow. Furthermore, the waveform need not be rectangular as illustrated. The cathodic and anodic pulses may have any voltage-time (or current-time) profile. In the following discussion rectangular pulses are assumed for simplicity. Again, one skilled in the art will recognize that the point in time chosen as the initial point of the pulse train is entirely arbitrary. Either the cathodic pulse or the anodic pulse (or any point in the pulse train) could be considered as the initial point. The representation with the cathodic initial pulse is introduced for simplicity in discussion.

In FIG. 1, the cathodic peak current is shown as $I_1$ and the cathodic on-time is $t_1$. Similarly, the anodic peak current is shown as $I_2$ and the anodic on-time is $t_2$. The relaxation time, or off-times are indicated by $t_a$, and $t_b$. The sum of the cathodic on-time, anodic on-time, and off-times (if present) is the period T of the pulse train ($T=t_1+t_2+t_a+t_b$), and the inverse of the period of the pulse train (1/T) is the frequency (f) of the pulse train. The ratio of the cathodic on-time to the period ($t_1/T$) is the cathodic duty cycle ($D_1$), and the ratio of the anodic on-time to the period ($t_2/T$) is the anodic duty cycle ($D_2$). The current density, i.e., current per unit area of the electrode, during the cathodic on-time and anodic on-time is known as the cathodic peak pulse current density and anodic peak pulse current density, respectively. The cathodic charge transfer density ($Q_1$) is the product of the cathodic current density and the cathodic on-time ($I_1T_1$), while the anodic charge transfer density ($Q_2$) is the product of the anodic current density and the anodic on-time ($I_2T_2$). The average current density ($i_{ave}$) is the average cathodic current density ($D_1I_1$) minus the average anodic current density ($I_2D_2$). Accordingly the relationships among the parameters may be represented by the following equations.

$$T = \frac{1}{f} = t_1 + t_2 + t_a + t_b \quad (1)$$

$$D_1 = \frac{t_1}{T} \quad (2)$$

$$D_2 = \frac{t_2}{T} \quad (3)$$

$$\frac{Q_1}{Q_2} = \frac{i_1 t_1}{i_2 t_2} \quad (4)$$

$$i_{ave} = i_1 D_1 - i_2 D_2 \quad (5)$$

$$D_1 + D_2 \le 1 \quad (6)$$

According to the invention the cathodic duty cycle should be relatively short, less than about 50%, and the cathodic pulses should be relatively short to favor uniform deposition of metal on both the concave (trenches) and convex (peaks) portions of the substrate surface. Preferably, the cathodic duty cycle is from about 30% to about 1%, more preferably from about 30% to about 15% and still more preferably from about 30% to about 20%.

Conversely, the anodic duty cycle should be relatively long, greater than about 50%, and the anodic pulses should be relatively long in order to favor removal of excess metal from the convex and peak portions of the substrate surface. Preferably, the anodic duty cycle is from about 60% to about 99%, more preferably from about 70% to about 85% and still more preferably from about 70% to about 80%. Because the anodic duty cycle is longer than the cathodic duty cycle, the peak anodic voltage (and corresponding current) will be less than the peak cathodic voltage (and corresponding current). Accordingly, the cathodic-to-anodic net charge ratio will be greater than one, in order to provide a net deposition of metal on the surface. Although the anodic removal of excess metal reduces the overall efficiency of the electroplating process, the benefits of filling the trenches in damascene-prepared surfaces and of avoiding excessive plating thickness at the edges of plated wafers more than compensate for any loss in electroplating efficiency.

The frequency of the pulse train used in the method of the invention may range from about 10 Hertz to about 5000 Hertz, preferably from about 100 Hz to about 3000 Hz and more preferably from about 500 Hz to about 1500 Hz.

Accordingly, the cathodic and anodic pulse widths may vary from about 1.0 microsecond to about 100 milliseconds. An anodic pulse is introduced between at least some of the cathodic pulses. However, it is not excluded that two or more cathodic pulses may be introduced between a pair of anodic pulses. In particular, a plurality of very short cathodic pulses may be followed by one relatively long anodic pulse. Accordingly, a number of cathodic and anodic pulses with defined pulse widths may make up one group of pulses, which is then repeated. Typically such a group would include one or more cathodic pulses and at least one anodic pulse. The period of a pulse train comprised of such pulse groups may conveniently be defined as the time from the beginning of one cathodic pulse to the beginning of the next cathodic pulse that is similarly situated in the pulse train. The frequency of the pulse train may then be defined as the reciprocal of the period, as discussed above.

The pulse width, duty cycle, and applied voltage of the cathodic and anodic pulses must be adjusted to provide that the overall process is cathodic, i.e., there is a net deposition of metal on the substrate workpiece. The practitioner will adapt the pulse width, duty cycle, and frequency to a particular application, based on the principles and teachings of the process of the invention.

The application of the method of the invention to filling trenches in damascene-prepared surfaces of semiconductor wafers is illustrated in FIGS. 3A–3F.

Figure 3A:
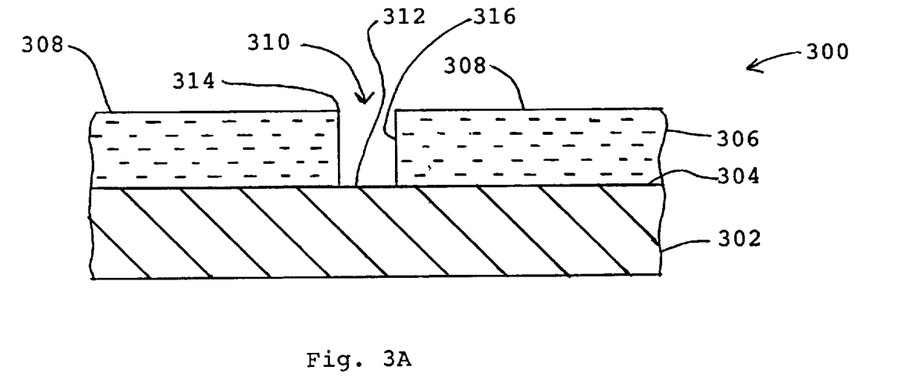
FIG. 3A is a cross section of a damascene-prepared substrate having a trench or depression formed in a layer of insulating material deposited on a semiconductor substrate.

FIG. 3A shows schematically a cross-section of a semiconductor wafer-insulating layer element 300 ready for metallizing to provide conductive traces on its surface. The element 300 comprises a semiconductor wafer 302 having formed on its surface 304 a layer of an insulating material 306, e.g., silicon dioxide. A trench 310 is formed in the insulating layer 306 by a conventional method. For example, a photoresist layer may be applied to the surface 308 of the insulating material 306, then exposed and developed to form a resist pattern on the surface 308. The patterned surface is then etched to form a trench 310, and the residual resist is removed.

In order to prepare the element 300 for depositing metal into the trench 310, a very thin barrier layer (not shown) is deposited, typically by physical vapor deposition (PVD), to prevent the metal, e.g., copper, from migrating into the semiconductor layer 302. Then a thin conducting layer (not shown) is applied (e.g., by PVD) over the entire surface of the element 300 to provide electrical conductivity for the electroplating step.

Figure 3B:
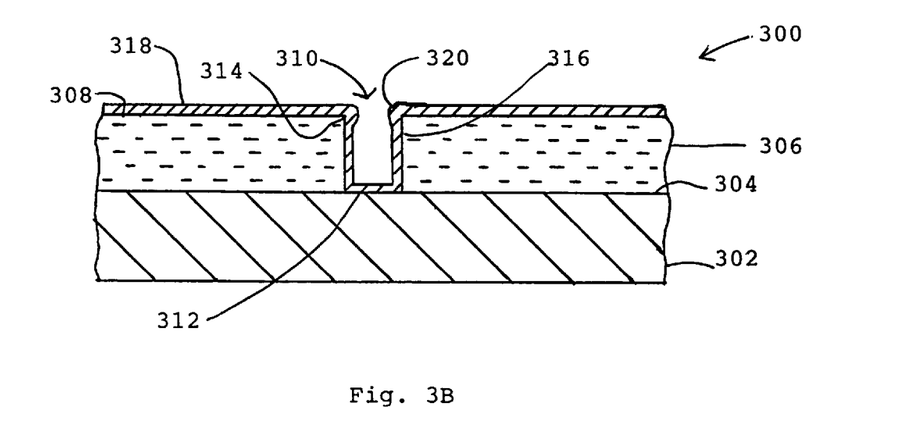
FIG. 3B is a schematic representation of the substrate of FIG. 2 after metal deposition by a cathodic pulse.

The element 300 is then immersed in a plating bath containing ions of the metal to be plated, e.g., copper ions. A counter electrode is also immersed in the plating bath, and the element to be plated 300 and the counter electrode are connected to a power supply that provides a modulated reversing electric field between the element and the counter electrode. The first pulse of the modulated reversing electric field is typically applied to make the element 300 to be plated the cathode, i.e., it is a cathodic pulse with respect to the element to be plated. The cathodic pulse causes a thin layer of metal to be plated onto the surface of the element 300, as shown in FIG. 3B. because the cathodic pulse is relatively short, the metal is deposited relatively uniformly over the surface of the element 300. However, because the pulse is of finite duration, a diffusion layer of some small thickness will develop, which may cause some non-uniformity in the layer of metal deposited. Accordingly, FIG. 3B shows some excess metal 320 deposited at the upper corners 314 of the trench 310. It will be understood by those skilled in the art that the layers of metal deposited by a single pulse are extremely thin, and the thicknesses as illustrated are necessarily exaggerated in order to show the tendency of the metal deposit established by the modulated electric field and corresponding modulated current.

Figure 3C:
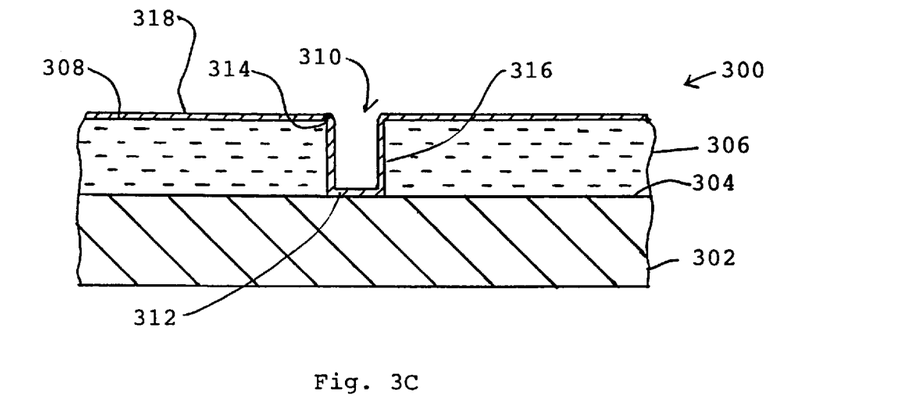
FIG. 3C is a schematic representation of the substrate of FIGS. 3A and 3B after a further treatment with an anodic pulse.

Subsequent to the cathodic pulse, an anodic pulse is applied to the element 300. The anodic pulse is relatively long compared to the cathodic pulse. Accordingly, a Nernst diffusion layer tends to be more fully established during the anodic pulse. Consequently, some of the metal plated during the cathodic pulse is removed during the anodic pulse. However, because the anodic pulse is of longer duration, the distribution of metal removal more closely resembles that produced by direct-current electrolysis, i.e., metal is preferentially removed from the microscopic peaks and convexities of the substrate. Accordingly, the excess metal 320 that may have been deposited during the cathodic pulse tends to be removed by the anodic pulse. The anodic pulse also tends to remove metal from the planar surface 308 of the element 300, but it tends to remove less metal from the bottom 312 and side walls 316 of the trench 310. FIG. 3C illustrates schematically the appearance of the element 300 after removal of the excess metal by the anodic pulse.

Figure 3D:
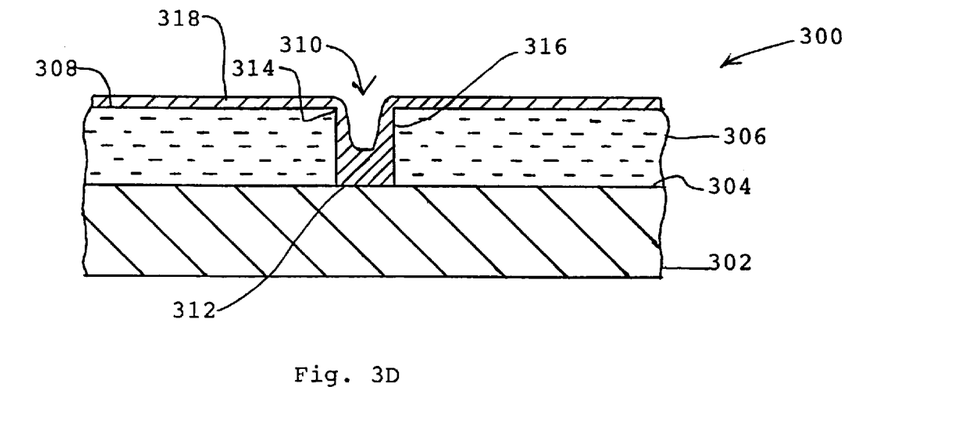
FIG. 3D is a schematic representation of the substrate of FIG. 3A after a succession of cathodic and anodic pulses, showing the preferential deposition of metal in the damascene trench.

As cathodic and anodic pulses succeed one another, the metal tends to be deposited preferentially in the trench, with reduced deposition of metal on the planar surface 308 of the element 300 and on the upper corners 314 of the trench 310. FIG. 3D illustrates schematically the distribution of deposited metal after the electroplating process using modulated revere electric fields has proceeded for some time.

Figure 3E:
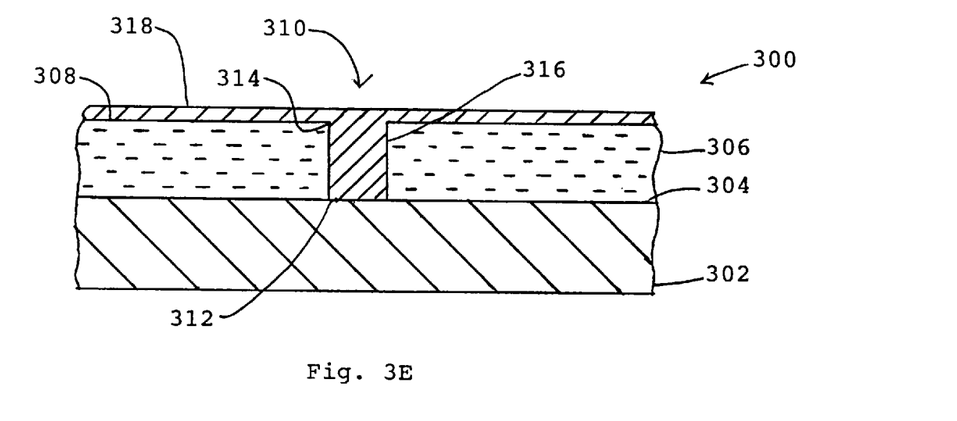
FIG. 3E is a cross section of the plated substrate of FIGS. 3A–3D after the damascene trench has been filled with metal, showing the filled trench and thin surface layer of metal.

FIG. 3E illustrates the distribution of plated metal on element 300 after the trench has been filled. The trench has been filled with solid metal, while the thickness of the plated metal layer on the planar surface 308 is relatively much thinner.

Figure 3F:
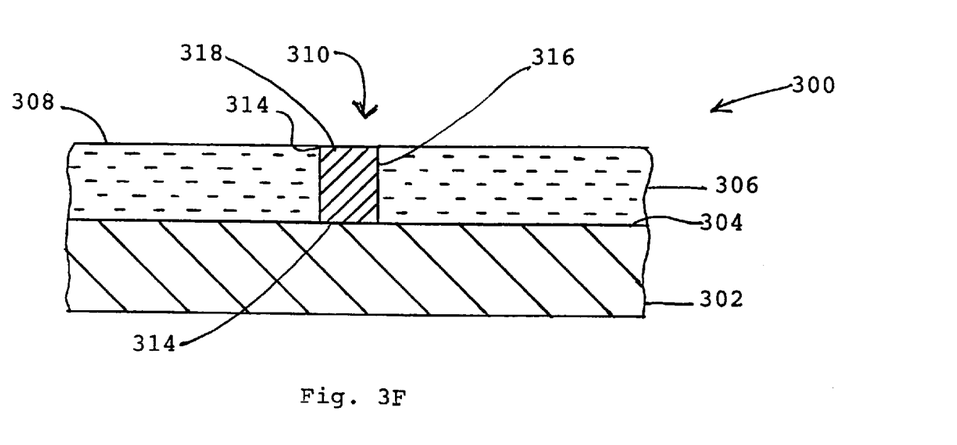
FIG. 3F is a cross section of the plated substrate of FIG. 3E after subsequent processing to remove the thin surface layer of metal.

In order to provide conductors insulated from one another by the layer 306 of insulating material, the excess metal on the planar surface 308 of the insulating material 306 is removed by any conventional procedure, e.g., by chemical-mechanical polishing (CMP), electropolishing, or other effective means. FIG. 3F shows a schematic cross section of the completed element.

Accordingly, the process of the invention, when applied to a damascene-prepared surface of a semiconductor wafer, is capable of providing solid, void-free conductors in the trenches and vias formed by the damascene process, while minimizing the amount of metal deposited on the planar surface of the element that has to be removed in a subsequent step of the manufacturing process. By adjusting the parameters of the modulated electric field waveform, e.g., the cathodic and anodic duty cycles, charge transfer ratio and frequency, the practitioner can produce a metallized damascene-prepared surface wherein the thickness of the metal layer deposited on the surface portions of semiconductor wafers metallized by the process of the invention will be no greater than the depth of metal deposited in the trenches. Preferably, the thickness of the surface layer will be substantially less than the depth of metal deposited in the trenches, e.g., no greater than about 80% of the depth of metal deposited in the trenches. More preferably, the thickness of the surface metal layer will amount to only about 50%, or 20%, or even 10% or less of the depth of metal deposited in the trenches.

The process of the invention can also be applied to deposition of a uniform metal layer on the surface of a semiconductor wafer, as is required for some manufacturing procedures. The application of the process of the invention to such wafers is illustrated in FIGS. 4A–4D.

Figure 4A:
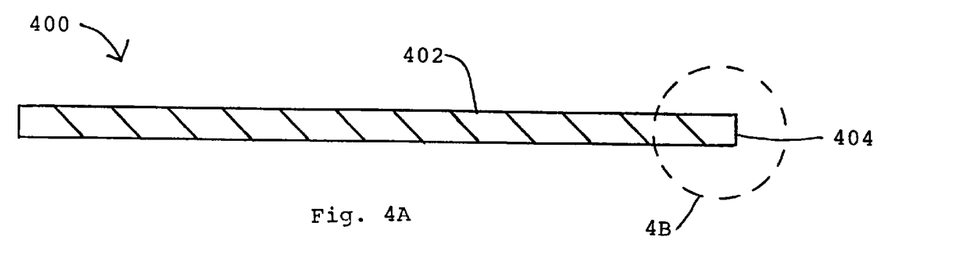
FIG. 4A is a cross section of a semiconductor wafer prepared for electrodeposition of a thin, uniform layer of metal on its surface.

FIG. 4A illustrates schematically a cross-section of a semiconductor wafer that has been cut from a single crystal of a semiconductor, e.g., silicon. Such wafers are typically round and very thin. In order to metallize the surface of the wafer a barrier layer (not shown) and a very thin conducting layer (not shown) are deposited, e.g., by CVD, as for the case of the damascene-prepared surface discussed above.

When a metal is deposited on the surface of such a wafer, the non-uniform distribution of current at the edges of the wafer gives rise to excess metal deposition at the edge. The excess metal causes the surface of the plated wafer to be somewhat nonplanar, and can interfere with subsequent manufacturing operations unless it is removed or prevented.

In order to avoid the problem of excess metal deposition at the edge of the wafer 400 without resorting to the use of auxiliary electrodes ("robbers"), shields positioned in the electroplating bath, or the like, the plating can be conducted using modulated reverse electric fields according to the invention.

Figure 4B:
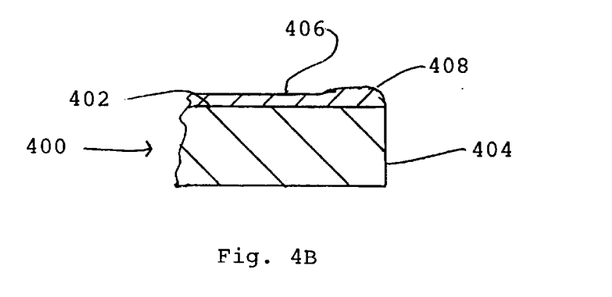
FIG. 4B shows one edge of the semiconductor wafer of FIG. 4A, indicated by circle 4B in FIG. 4A, in an enlarged view after metal deposition by a cathodic pulse, showing the excess thickness of metal deposited at the edge of the wafer with a much exaggerated vertical dimension.

FIG. 4B shows an enlarged cross section of the edge of the wafer 400 as indicated by the circle 4B in FIG. 4A. A metal layer 406 is shown schematically and with exaggerated thickness as deposited on the surface 402 of the wafer 400 near its edge 404 after the first, relatively short, cathodic current pulse. As discussed above for the damascene-prepared surface, because the cathodic pulse is of finite duration, there may be some non-uniformity in the deposition of the metal layer, as shown by the excess metal 408 deposited at the edge 404 of the wafer 400.

Figure 4C:
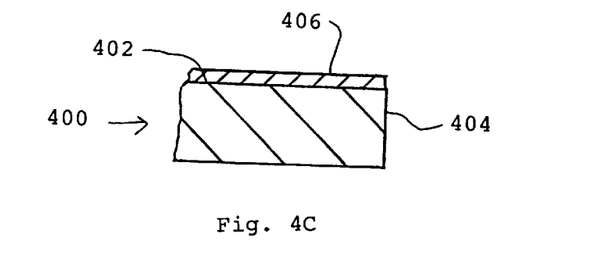
FIG. 4C shows the edge portion of the wafer edge of FIG. 4B after a subsequent anodic pulse, showing removal of excess metal near the edge of the wafer, with a greatly exaggerated vertical dimension.

FIG. 4C shows schematically the configuration of the deposited metal layer after a subsequent anodic pulse of relatively long duration. Such a long anodic pulse will remove metal non-uniformly and preferentially from the elevated and/or convex portions of the wafer surface. Accordingly, the excess metal 408 that may have been deposited by the cathodic pulse tends to be removed by a subsequent anodic pulse.

Figure 4D:
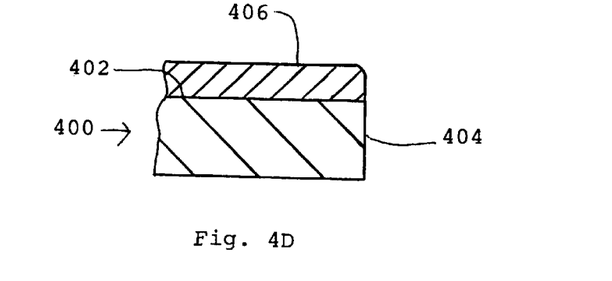
FIG. 4D shows the edge portion of the wafer of FIGS. 4A–4C after a succession of cathodic and anodic pulses, showing the thin, uniform layer of metal extending with a generally constant thickness to the edge of the wafer.

FIG. 4D shows schematically the plated metal layer 406 at the edge 404 of the wafer 400 after the plating has been completed. The plated layer 406 ideally extends smoothly and with essentially constant thickness to the edge of the wafer. Furthermore, the plated metal layer 406 will also tend to fill any microscopic depressions in the surface 402 of the wafer 400.

The method of the invention may be used with any metal that can be deposited by electroplating techniques. Thus copper, silver, gold, zinc, chromium, nickel, and alloys thereof such as bronze, brass, and the like, may be applied to microrough surfaces by the process of the invention. The invention is particularly useful in filling trenches and vias in damascene-prepared surfaces generated in the manufacture of VLSI semiconductor devices and the like and in preparing planar layers of metal on large-diameter semiconductor wafers.

The electroplating bath used in the process of the invention can be any conventional electroplating bath appropriate for the metal being plated. For electroplating copper onto a semiconductor surface, particularly when preparing microscopic conductors by the damascene process, it is preferred to avoid conventional additives such as leveling agents and the like to the extent possible, in order to avoid the difficulties of using such additives such as possible inclusion in the plated conductors. A preferred bath for electroplating copper onto a microrough surface is an aqueous acidic copper sulfate bath incorporating about 40 to about 80 g/L of copper sulfate, a molar ratio of sulfuric acid to copper sulfate of about 5:1 to about 8:1, about 5% of polyethylene glycol and about 30 ppm to about 60 ppm of chloride ion. A pulse train frequency of about 1000 Hz with a cathodic duty cycle of about 20%, an anodic duty cycle of about 75% and a cathodic/anodic charge transfer ratio of 5 or less appeared to give superior results.

The invention having now been fully described, it should be understood that it may be embodied in other specific forms or variations without departing from its spirit or essential characteristics. Accordingly, the embodiments described above are to be considered in all respects as illustrative and not restrictive, the scope of the invention being indicated by the appended claims rather than the foregoing description, and all changes which come within the meaning and range of equivalency of the claims are intended to be embraced therein.

We claim:

1. A method for depositing a smooth layer of a metal onto a microrough substrate comprising
   immersing an electrically conductive substrate having a microrough surface in an electroplating bath containing ions of a metal to be deposited onto said surface,
   immersing a counter electrode in said plating bath, passing an electric current between said substrate and said counterelectrode for an essentially continuous period of time until microscopic depressions on said microrough surface have been filled with said metal,
   wherein
      said electric current is a modulated reversing electric current comprising a train of pulses that are cathodic with respect to said substrate and pulses that are anodic with respect to said substrate,
      said cathodic pulses have a duty cycle less than about 50% and said anodic pulses have a duty cycle greater than about 50%,
      the charge transfer ratio of said cathodic pulses to said anodic pulses is greater than one, and
      the frequency of said pulse train ranges from about 10 Hertz to about 5000 Hertz, and
      said plating bath is substantially devoid of leveling agents.

2. The method of claim 1 wherein an interval of no electric current flow is interposed between said cathodic pulses and succeeding anodic pulses.

3. The method of claim 1 wherein an interval of no electric current flow is interposed between said anodic pulses and succeeding cathodic pulses.

4. The method of claim 1 wherein an interval of no electric current flow is interposed between said cathodic pulses and succeeding anodic pulses and between said anodic pulses and succeeding cathodic pulses.

5. The method of claim 1 wherein said cathodic pulses and said anodic pulses succeed each other without intervening intervals of no electric current flow.

6. The method of claim 1 wherein said cathodic pulses and said anodic pulses form a pulse train having a frequency between about 50 Hertz and about 5000 Hertz.

7. The method of claim 1 wherein said cathodic pulses and said anodic pulses form a pulse train having a frequency between about 100 Hertz and about 3000 Hertz.

8. The method of claim 1 wherein said cathodic pulses and said anodic pulses form a pulse train having a frequency between about 500 Hertz and about 1500 Hertz.

9. The method of claim 1 wherein said cathodic pulses have a duty cycle of from about 30% to about 1%.

10. The method of claim 1 wherein said cathodic pulses have a duty cycle of from about 30% to about 15%.

11. The method of claim 1 wherein said cathodic pulses have a duty cycle of from about 30% to about 20%.

12. The method of claim 1 wherein said anodic pulses have a duty cycle of from about 60% to about 99%.

13. The method of claim 1 wherein said anodic pulses have a duty cycle of from about 70% to about 85%.

14. The method of claim 1 wherein said cathodic pulses have a duty cycle of from about 70% to about 80%.

15. The method of claim 1 wherein said metal is selected from the group consisting of copper, silver, gold, zinc, chromium, nickel, bronze, brass, and alloys thereof.

16. The method of claim 1 wherein said metal is copper.

17. The method of claim 1 wherein said bath consists essentially of about 40 g/L to about 80 g/L of copper sulfate, sulfuric acid in a molar ratio of sulfuric acid to copper sulfate of about 5:1 to about 8:1, about 5% by weight of polyethylene glycol and about 30 parts per million to about 60 parts per million of chloride ion.

18. A method for filling a microscopic recess in a surface of an electrically conducting substrate with a void-free deposit of metal comprising
   immersing an electrically conductive substrate having a surface and at least one microscopic recess in said surface in an electroplating bath containing ions of a metal to be deposited into said recess, said plating bath being essentially devoid of leveling agents,
   immersing a counter electrode in said plating bath, passing an electric current essentially continuously between said substrate and said counterelectrode for a period of time until said recess has been filled with said metal,
   wherein
      said electric current is a modulated reversing electric current comprising a train of pulses that are cathodic with respect to said substrate and pulses that are anodic with respect to said substrate,
      said cathodic pulses have a duty cycle less than about 50% and said anodic pulses have a duty cycle greater than about 50%,
      the charge transfer ratio of said cathodic pulses to said anodic pulses is greater than one, and
      the frequency of said pulse train ranges from about 10 Hertz to about 5000 Hertz.

19. The method of claim 18 wherein said passage of electric current is terminated promptly when said recess has been filled with said metal.

20. The method of claim 18 wherein said metal is copper.

21. The method of claim 18 wherein said bath consists essentially of about 40 g/L to about 80 g/L of copper sulfate, sulfuric acid in a molar ratio of sulfuric acid to copper sulfate of about 5:1 to about 8:1, about 5% by weight of polyethylene glycol and about 30 parts per million to about 60 parts per million of chloride ion.

* * * * *